US011596065B2

(12) United States Patent
Choi et al.

(10) Patent No.: US 11,596,065 B2
(45) Date of Patent: Feb. 28, 2023

(54) METHOD OF MANUFACTURING POLYIMIDE FILM

(71) Applicant: Yu Kyoung Choi, Yongin-si (KR)

(72) Inventors: Yu Kyoung Choi, Yongin-si (KR); Jong Un Park, Yongin-si (KR)

(73) Assignee: Yu Kyoung Choi, Yongin-si (KR)

( * ) Notice: Subject to any disclaimer, the term of this patent is extended or adjusted under 35 U.S.C. 154(b) by 0 days.

(21) Appl. No.: 17/578,688

(22) Filed: Jan. 19, 2022

(65) Prior Publication Data

US 2022/0256697 A1    Aug. 11, 2022

(30) Foreign Application Priority Data

Feb. 5, 2021    (KR) .................. 10-2021-0016531

(51) Int. Cl.
| H05K 1/03 | (2006.01) |
| H05K 1/02 | (2006.01) |
| H05K 1/11 | (2006.01) |
| B05D 3/04 | (2006.01) |
| B05D 1/12 | (2006.01) |

(52) U.S. Cl.
CPC ............ H05K 1/0373 (2013.01); B05D 1/12 (2013.01); B05D 3/0413 (2013.01); H05K 1/028 (2013.01); H05K 1/115 (2013.01); H05K 2201/0154 (2013.01); H05K 2201/0212 (2013.01)

(58) Field of Classification Search
CPC ...... B05D 1/12; B05D 3/0413; H05K 1/0373; H05K 1/028; H05K 1/115; H05K 2201/0154; H05K 2201/0212
USPC ....................................................... 427/180
See application file for complete search history.

(56) References Cited

U.S. PATENT DOCUMENTS

| 4,816,516 A | * | 3/1989 | Yamaya .................. C08L 27/12 |
| | | | 525/184 |
| 5,556,899 A | * | 9/1996 | Afzali-Ardakani ...... C08K 3/04 |
| | | | 252/502 |
| 7,026,032 B2 | * | 4/2006 | Lee ........................ C08G 73/10 |
| | | | 428/221 |

FOREIGN PATENT DOCUMENTS

| CN | 103958188 | | 7/2014 |
| JP | 2007014862 A | * | 1/2007 |
| JP | 2014-526399 | | 10/2014 |
| JP | 2017525585 A | * | 9/2017 |
| JP | 2017191230 A | * | 10/2017 |
| JP | 6387181 | | 9/2018 |
| KR | 10-2012-0137904 | | 12/2012 |
| KR | 10-2013-0027442 | | 3/2013 |
| KR | 10-1503332 | | 3/2015 |
| KR | 10-2016-0090153 | | 7/2016 |
| KR | 10-2019-0029607 | | 3/2019 |
| KR | 10-2020-0083410 | | 7/2020 |
| KR | 10-2020-0132203 | | 11/2020 |

* cited by examiner

*Primary Examiner* — Brian K Talbot
(74) *Attorney, Agent, or Firm* — Kile Park Reed & Houtteman PLLC (57) ABSTRACT

Provided are a polyimide film capable of reducing a dielectric constant of a substrate and reducing a thickness and forming a stable via with a low possibility of disconnection, a method for manufacturing the same, and an FPCB including the same. A polyimide film according to an exemplary embodiment of the present invention includes a polyimide layer and a plurality of fluororesin particles dispersed in the polyimide layer. The fluororesin particles have a spherical or flat shape.

4 Claims, 6 Drawing Sheets

METHOD OF MANUFACTURING POLYIMIDE FILM

CROSS REFERENCE TO RELATED APPLICATION

This application claims priority from and the benefit of Korean Patent Applications No. 10-2021-0016531, filed on Feb. 5, 2021, which is hereby incorporated by reference for all purposes as if fully set forth herein.

BACKGROUND OF THE INVENTION

Field of the Invention

The present invention relates to a polyimide film, a method of manufacturing the polyimide film, and a flexible printed circuit board having the polyimide film.

Discussion of the Background

A polyimide film is well known for excellent properties such as high heat resistance, cold resistance, chemical resistance, electrical insulation ability, and mechanical strength, and in particular, a polyimide film is widely used as an electrical insulation film, heat resistance film, and a base film for a flexible printed circuit board (FPCB).

In addition to these advantages, in order that a polyimide film is applied to an FPCB (FPCB), many studies have been conducted on adhesion between a wiring layer and a polyimide film as a major issue. However, relatively little research has been done on permittivity and dielectric loss.

In general, the higher the frequency, the lower the dielectric constant and the lower dielectric loss FPCB is required. In line with the 5G era, higher frequencies are required. In detail, 4G frequencies requires approximately 2 GHZ, but 5G requires higher and higher frequencies such as 28 GHZ, 40 GHZ, and 60 GHZ. In order to reduce the loss of such a frequency band, as mentioned above, a low permittivity and a dielectric loss should be preceded.

In Korean Patent Laid-Open No. 10-2019-0029607, "The manufacturing method and porous polyimide film manufactured by the method of the porous polyimide film", a method for lowering the dielectric constant by configuring the polyimide film as a porous material is proposed. That is, the dielectric constant is lowered by configuring the polyimide film with a porous material containing air having a dielectric constant of 1 on a conventional polyimide film having a dielectric constant of about 3.5.

According to the above method, the conventional polyimide film itself is composed of a porous material with air permeability, thereby lowering the dielectric constant, but the strength is lowered due to the porous structure, which causes a problem when applied as an FPCB. That is, when a conductive pattern is formed on the upper surface of the porous polyimide film, the conductive pattern may be disconnected because the adhesive strength of the conductive pattern is weak.

In addition, even if the conductive pattern is adhered, the porous polyimide film can be easily stretched, so the disconnection problem of the conductive pattern becomes a bigger problem.

On the other hand, in Korean Patent Laid-Open No. 10-2016-0090153, "Method for preparation of polyimide film using porous particles and polyimide film having low permittivity", particles containing air with low dielectric constant are dispersed inside the polyimide film to lower the dielectric constant.

Figure 1:
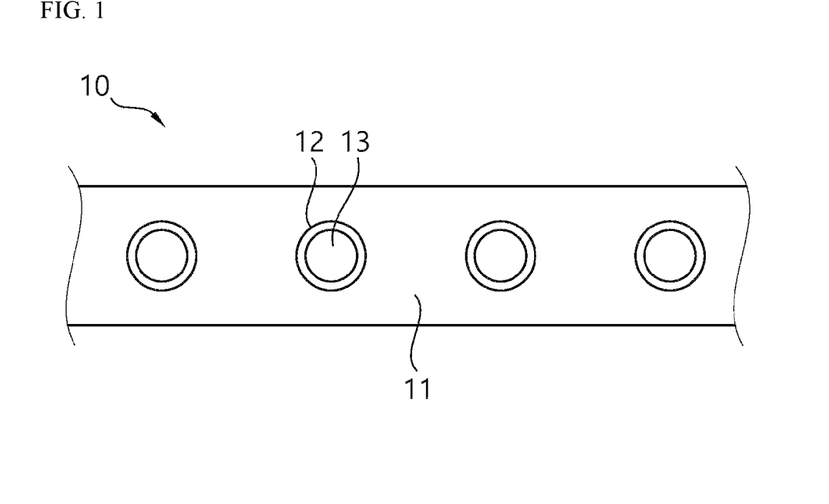
FIG. 1 is a schematic cross-sectional view showing a conventional polyimide film including hollow particles.

FIG. 1 is a schematic cross-sectional view showing a conventional polyimide film including hollow particles.

Referring to FIG. 1, in a polyimide film 10, particles 12 having a hollow 13 are dispersed inside the polyimide layer 11, so that the permittivity is lowered by the hollow 130 while maintaining the strength of the polyimide film 10. However, in order for the polyimide film 10 to exhibit the performance of lowering the dielectric constant, the thickness of the polyimide film 10 must be about 80 µm or more. In other words, when the size of the particles 12 having the hollow 13 is 80 µm or more, it is seen that the dielectric constant is lowered. Considering the thickness of the material constituting the particle 12, it is assumed that the actual amount of air is very small. Moreover, when manufacturing an FPCB using the polyimide film 10, the following problems may occur.

Figure 2:
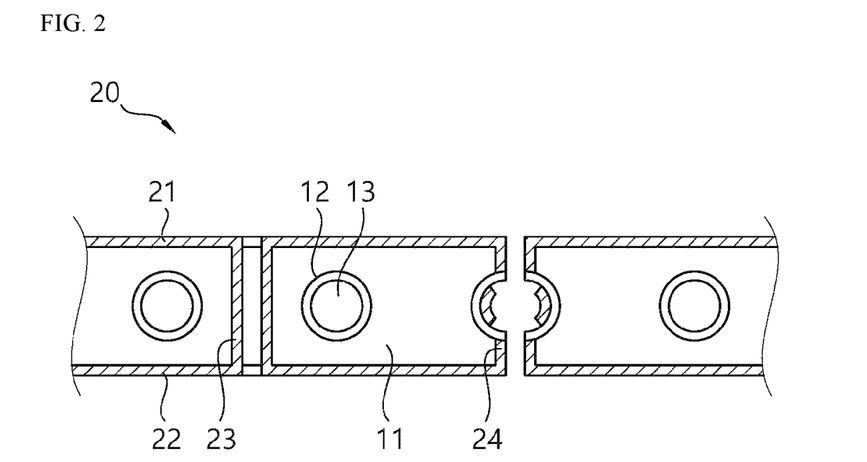
FIG. 2 is a schematic cross-sectional view showing an FPCB using the polyimide film of FIG. 1.

FIG. 2 is a schematic cross-sectional view showing an FPCB using the polyimide film of FIG. 1.

Referring to FIG. 2, in the FPCB 20 formed using the polyimide film 10 shown in FIG. 1, the via connection is not stable, and thus, disconnection occurs frequently. In more detail, when the first conductive pattern layer 21 formed on the first surface of the polyimide layer 11 and the second conductive pattern layer 22 formed on the second surface of the polyimide layer 11 are connected through a via, there is no problem in the case of the first via 23 formed in the region where particles do not exist, but when the second via 24 is formed through the particle 12 including the hollow 13, as shown, there is a problem in that the electrical connection is unstable and disconnection occurs.

SUMMARY OF THE INVENTION

Therefore, the present invention provides a polyimide film capable of reducing dielectric constant and thickness, and capable of forming stable via when an FPCB is formed by using the polyimide film.

The present invention provides a method for manufacturing the polyimide film.

The present invention provides an FPCB using the polyimide film.

A polyimide film according to an exemplary embodiment of the present invention includes a polyimide layer and a plurality of fluororesin particles dispersed in the polyimide layer. The fluororesin particles have a spherical or flat shape.

As an embodiment, the fluororesin particles may include at least one of PTFE, PVDF, and TPA.

As an embodiment, the fluororesin particles may be dispersed in a single layer inside the polyimide layer.

Alternatively, the fluororesin particles may be dispersed in a multi-layers spaced apart with each other with polyimide inside the polyimide layer.

As an embodiment, the fluororesin particles may be electrically charged.

A method of manufacturing polyimide film according to an exemplary embodiment of the present invention, includes applying a polyimide precursor to a base plate, dispersing fluororesin particles having a spherical or flat shape in the polyimide precursor, applying a polyimide precursor to the dispersed fluororesin particles, heat-treating the polyimide precursor, and separating the base plate.

As an embodiment, the method may further include charging the resin particles with a second charge, before dispersing the fluororesin particles.

As an embodiment, the method may further include charging the base plate with a first charge having a polarity opposite to that of the second charge.

As an embodiment, the method may further include spraying a polyimide precursor onto the dispersed fluororesin particles, before applying the polyimide precursor to the dispersed fluororesin particles.

As an embodiment, the method may further include scraping a top surface of the applied polyimide precursor, before heat-treating the polyimide precursor.

As an embodiment, the method may further include dispersing fluororesin particles having a spherical or flat shape on the upper surface of the applied polyimide precursor, before heat-treating the polyimide precursor.

A flexible printed circuit board (FPCB) according to an exemplary embodiment of the present invention includes a polyimide layer, a plurality of fluororesin particles, a first conductive pattern, a second conductive pattern and a via. The polyimide layer includes a first surface and a second surface opposite to the first surface. The plurality of fluororesin particles are dispersed in the polyimide layer. The first conductive pattern layer is formed on the first surface of the polyimide layer. The second conductive pattern layer is formed on the second surface of the polyimide layer. The via passes through the polyimide layer to electrically connect the first conductive pattern layer and the second conductive pattern layer. The fluororesin particles have a spherical or flat shape.

As described above, according to the polyimide film according to the present invention, the dielectric constant of the substrate can be reduced, the thickness can be reduced, and a stable via with a low possibility of disconnection can be formed.

DETAILED DESCRIPTION OF THE ILLUSTRATED EMBODIMENTS

The present invention is described more fully hereinafter with reference to the accompanying drawings, in which example embodiments of the present invention are shown. The present invention may, however, be embodied in many different forms and should not be construed as limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity.

It will be understood that, although the terms first, second, etc. may be used herein to describe various elements, these elements should not be limited by these terms. These terms are only used to distinguish one element from another element. For example, a first element discussed below could be termed a second element, and similarly, a second element may also be termed a first element, without departing from the teachings of the present invention.

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, components, and/or groups thereof but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs.

It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present invention relates to a functional sheet manufactured through a powder spray method capable of enhancing safety and function due to not using an organic solvent which is harmful to the human body, and a method for manufacturing the functional sheet.

Hereinafter, referring to FIG. 1, a method of manufacturing a functional sheet through a powder spray method according to an embodiment of the present invention will be described in more detail.

Figure 3:
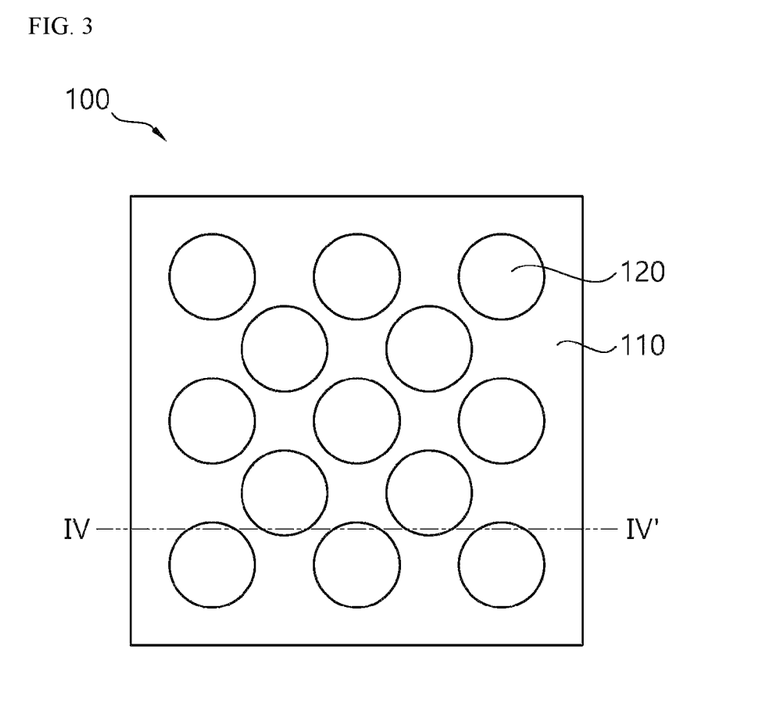
FIG. 3 is a plan view showing a polyimide film according to an exemplary embodiment of the present invention.
Figure 4:
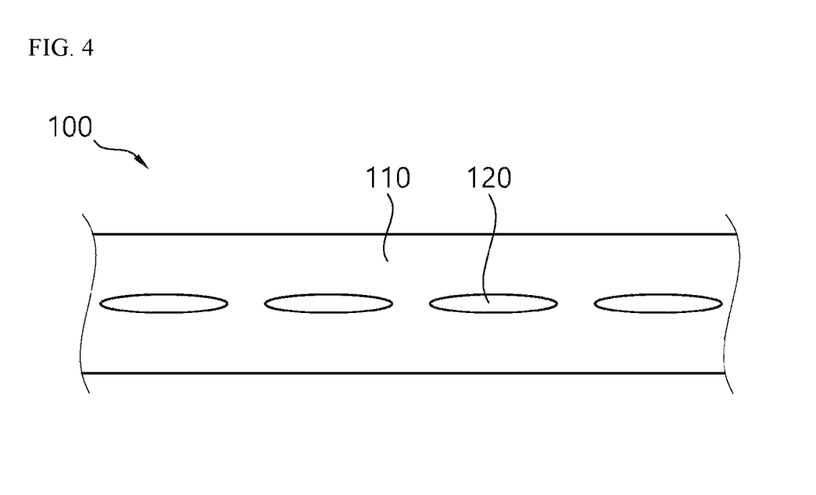
FIG. 4 is a cross-sectional view showing the polyimide film cut along a line IV-IV' shown in FIG. 3.

FIG. 3 is a plan view showing a polyimide film according to an exemplary embodiment of the present invention, and FIG. 4 is a cross-sectional view showing the polyimide film cut along a line IV-IV' shown in FIG. 3.

Referring to FIGS. 3 and 4, a polyimide film 100 according to an exemplary embodiment of the present invention includes a polyimide layer 110 and a plurality of fluororesin particles 120.

The plurality of fluororesin particles 120 are dispersed in the polyimide layer 110. In addition, the fluororesin particles 110 have a spherical or flat shape. In this embodiment, the spherical shape includes those having a substantially spherical shape other than a perfect sphere, and the flat shape is a shape that is flat in a plan view as in FIG. 3 and thin as in FIG. 4, and each edge may form an angle or have a round shape, and the planar shape is not limited, and refers to any shape having a small cross-sectional area compared to the planar area.

For example, the fluororesin particles 120 may include at least one of PTFE, PVDF, and TPA.

Meanwhile, the fluororesin particles 120 may be dispersed in a single layer inside the polyimide layer. In addition, the fluororesin particles 120 may be in a charged state. The fluororesin particles 120 do not require charging for doing some function but the fluororesin particles 120 with electric charge are a result of specific manufacturing process. The manufacturing process will be explained in detail.

As such, the polyimide film 100 according to an exemplary embodiment of the present invention includes the fluororesin particles 120 having a flat shape with low dielectric constant, so a low dielectric constant of the polyimide film 100 can be achieved, and the thickness of the polyimide film 100 can be reduced compared to the polyimide film 10 having particles 12 with a spherical hollow 13 in FIG. 1. On the other hand, although not shown, even when the fluororesin particles 120 have a spherical shape, the polyimide film 100 with the fluororesin particles 120 with a spherical shape can have reduced thickness compared to the conventional polyimide film 100 having particles 12 with hollow 13 shown in FIG. 1.

Figure 5:
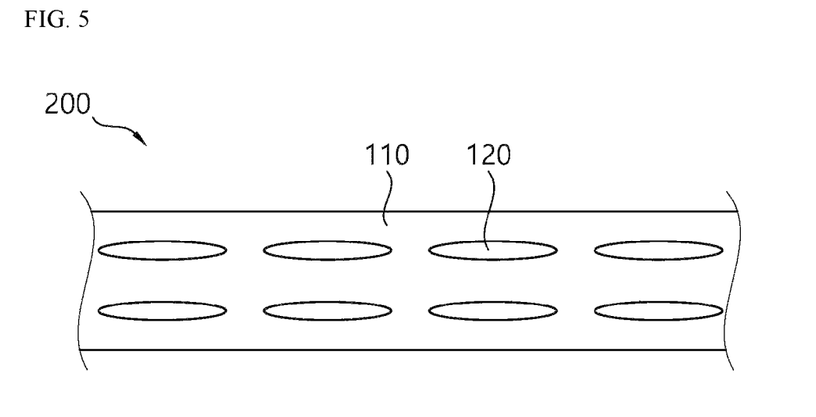
FIG. 5 is a cross-sectional view showing a polyimide film according to another exemplary embodiment of the present invention.

FIG. 5 is a cross-sectional view showing a polyimide film according to another exemplary embodiment of the present invention. The polyimide film according to another exemplary embodiment of the present invention shown in FIG. 5 is substantially the same as the polyimide film shown in FIGS. 3 and 4 except for the number of layers of fluororesin particles. Accordingly, the same or similar components are denoted by the same reference numerals, and any further descriptions will be omitted.

Referring to FIG. 5, a polyimide film 200 according to another exemplary embodiment of the present invention may have two layers of fluororesin particles 120. In this case, each layer of the fluororesin particles 120 may be spaced apart from each other with a polyimide material interposed therebetween. Meanwhile, although only two layers are illustrated in FIG. 5, more layers may be formed.

As such, in the case of having multi-layered fluororesin particles 120, if a thick polyimide film is required as necessary, the dielectric constant may be lowered and the polyimide film may be formed thickly.

Figure 6:
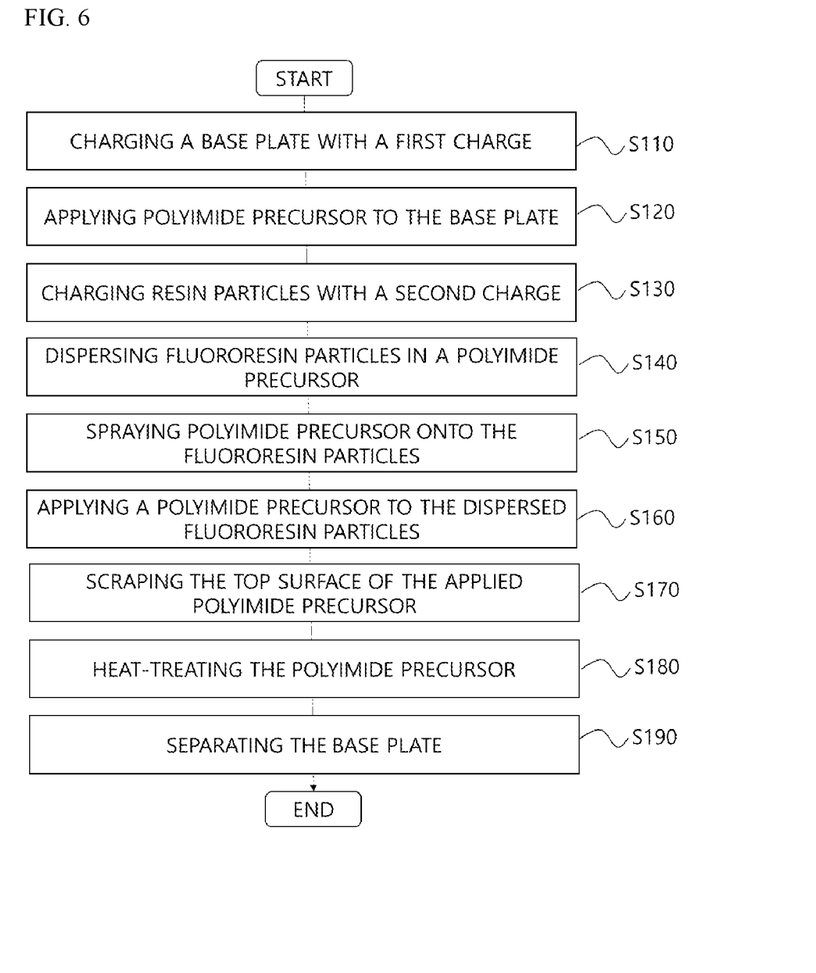
FIG. 6 is a flowchart showing a method of manufacturing a polyimide film according to an exemplary embodiment of the present invention.

FIG. 6 is a flowchart showing a method of manufacturing a polyimide film according to an exemplary embodiment of the present invention. Each step shown in FIG. 6 shows both essential and non-essential steps for convenience of description. Each step will be described in the description below.

Referring to FIG. 6, a method of manufacturing a polyimide film according to an exemplary embodiment of the present invention includes applying a polyimide precursor to a base plate (step S120), dispersing fluororesin particles having a spherical or flat shape to the polyimide precursor (step S140), applying a polyimide precursor to the dispersed fluororesin particles (step S160), heat-treating the polyimide precursor (step S180), and separating the base plate (step S190).

As an embodiment, the method of manufacturing a polyimide film may further include charging a base plate with a first charge (step S110), and charging resin particles with a second charge opposite to the first charge (step S130) before the step of applying a polyimide precursor to a base plate (step S120). Meanwhile, steps S110, S120, and S130 may be arranged in any order. That is, before charging to the base plate, the fluororesin particles may be charged, or after the polyimide precursor is applied to the base plate, charging to the base plate may be performed.

In addition, as an embodiment, the method of manufacturing a polyimide film may further include spraying the polyimide precursor onto the dispersed fluororesin particles (step S150) before the step of applying a polyimide precursor to the dispersed fluororesin particles (step S160).

As an embodiment, the method of manufacturing a polyimide film may further include scraping the top surface of the applied polyimide precursor (step S170), before the step of heat-treating the polyimide precursor (step S180).

As an embodiment, the method of manufacturing a polyimide film may further include dispersing fluororesin particles having a spherical or flat shape onto a surface of the polyimide precursor applied to the base plate (not shown) before the step of heat-treating of the polyimide precursor (step S180). This process is for forming a polyimide film having multi-layered fluororesin particles shown in FIG. 5, and subsequent steps may be performed in the same manner.

Hereinafter, each step will be described in more detail with reference to the drawings.

Figure 7:
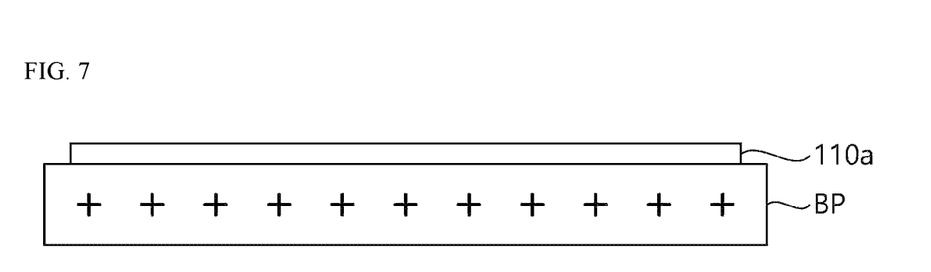
FIG. 7 is a cross-sectional view showing the process of step S120 of FIG. 6.

FIG. 7 is a cross-sectional view showing the process of step S120 of FIG. 6.

Referring to FIG. 7, a polyimide precursor 110a is applied to a base plate BP. For example, the base plate BP is a plate made of a metal. A voltage is applied to the base plate BP, then, the base plate BP is separated from a voltage source to be maintained in a floating state, so that the base plate BP can be electrically charged. For example, the base plate BP may be positively charged.

As the polyimide precursor 110a, anything that can become a polyimide resin by imidization may be used. For example, the polyimide precursor 110a may be a polyamic acid obtained by copolymerizing an acid dianhydride component and a diamine component in the presence of an organic solvent as a conventional method. The acid dianhydride component and the diamine component may be appropriately selected from those commonly used in the preparation of polyamic acids, respectively.

As the acid dianhydride component, for example, biphenyltetracarboxylic dianhydride or a derivative thereof, pyromellitic dianhydride (PMDA), 3,3'4,4'-benzophenonetetracarboxylic anhydride, p-phenylene-bis trimellitic dianhydride, etc. may be used, but the present invention is not limited thereto.

As the diamine component, for example, para-phenylenediamine (pPDA), diaminophenyl ether, o-phenylenediamine, m-phenylenediamine, 4,4-diaminodiphenyl ether (ODA), 3,4-diaminodiphenyl ether, 2,4-diaminodiphenyl ether, etc. may be used, but the present invention is not limited thereto. The acid dianhydride component and the diamine component may be mixed in a molar ratio of 1:0.9 to 1:1.1.

As the organic solvent, for example, N,N'-dimethylformamide (DMF), N,N'-dimethylacetamide (DMAc), N-methyl-pyrrolidone (NMP), and the like may be used, but the present invention is not limited thereto.

Figure 8:
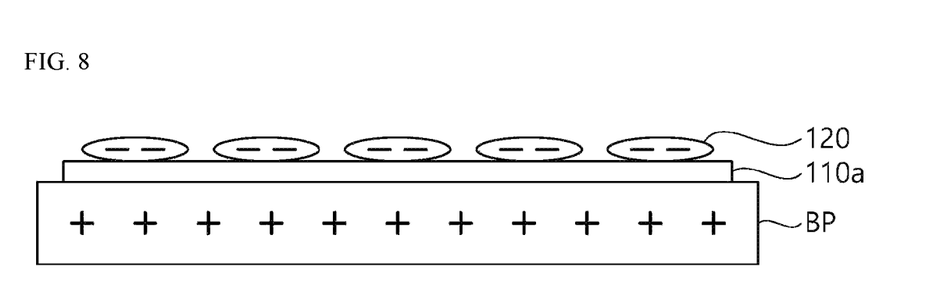
FIG. 8 is a cross-sectional view showing the process of step S140 of FIG. 6.

FIG. 8 is a cross-sectional view showing the process of step S140 of FIG. 6.

Referring to FIG. 8, fluororesin particles 120 having a spherical or flat shape are dispersed in a polyimide precursor 110a applied to a base plate BP. In this case, the fluororesin particles 120 as a dielectric may be charged to have an electric charge by friction with other materials. Alternatively, by irradiating ions or electrons to the fluororesin particles 120, the fluororesin particles 120 may be charged. Accordingly, the fluororesin particles 120 are attracted to the base plate BP charged with opposite polarity. Further, the fluororesin particles 120 of the same polarity are prevented from being stacked in two or three layers by mutual repulsion, and achieve the most uniform distribution in a plane view. In addition, when only the fluororesin particles 120 are charged without charging the base plate BP with the first charge, there is no attractive force between the base plate BP and the fluororesin particles 120, but the fluororesin particles 120 of the same polarity are prevented from being stacked in two or three layers by mutual repulsion, and achieve the most uniform distribution in a plane view.

Figure 9:
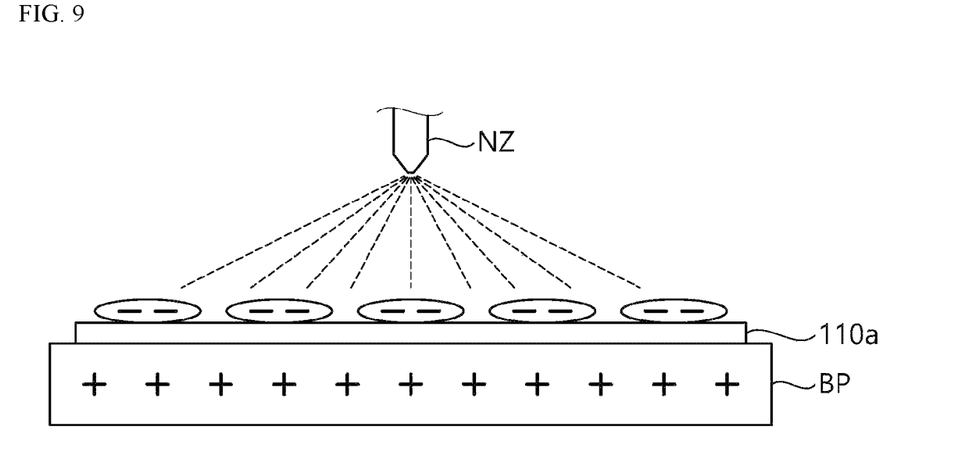
FIG. 9 is a cross-sectional view showing the process of step S150 of FIG. 6.

FIG. 9 is a cross-sectional view showing the process of step S150 of FIG. 6.

Referring to FIG. 9, the polyimide precursor may be sprayed onto the dispersed fluororesin particles 120 through the nozzle NZ. The polyimide precursor dispersed into fine particles by the nozzle NZ in this way fills the fine gaps between the fluororesin particles 120 in advance, thereby preventing the formation of bubbles in the polyimide film to be manufactured. Accordingly, it is possible to prevent the via from being disconnected in a process of manufacturing an FPCB.

Figure 10:
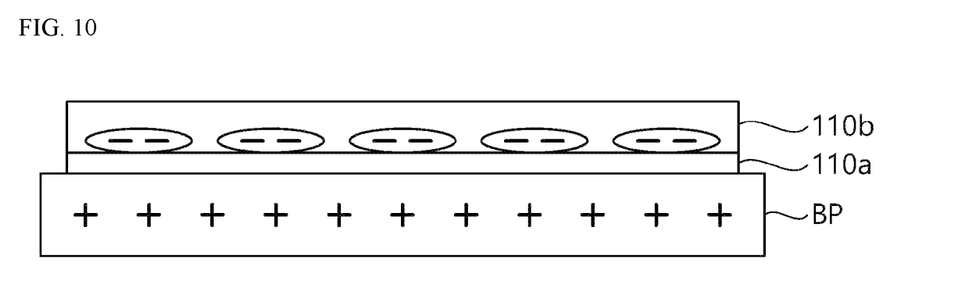
FIG. 10 is a cross-sectional view showing the process of step S160 of FIG. 6.

FIG. 10 is a cross-sectional view showing the process of step S160 of FIG. 6.

Referring to FIG. 10, a polyimide precursor 110b is applied on the fluororesin particles 120 in which the fine gaps are filled in the previous step.

Figure 11:
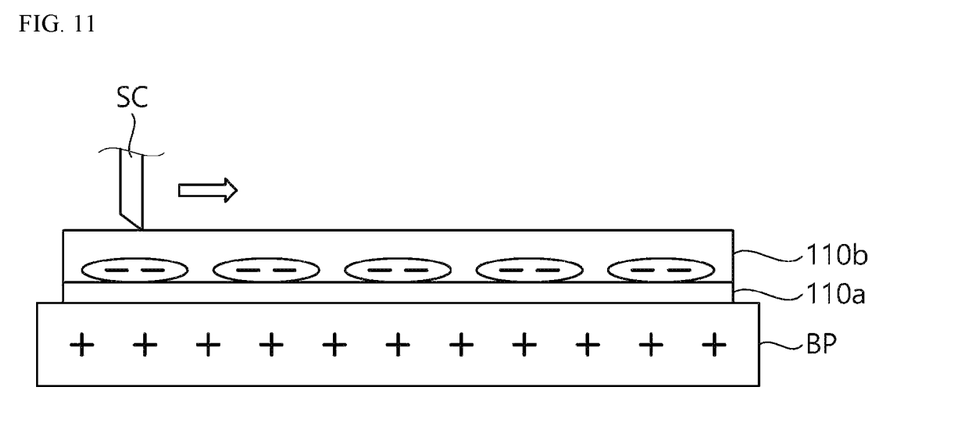
FIG. 11 is a cross-sectional view showing the process of step S170 of FIG. 6.

FIG. 11 is a cross-sectional view showing the process of step S170 of FIG. 6.

Referring to FIG. 11, the upper surface of the polyimide precursor 110b may be scraped through a scraper (SC) to form a smooth upper surface of the polyimide film.

Then, after heat-treating as in step S160 in FIG. 6, the base plate BP is removed. The heat-treating for imidization may include a process of primary heat treatment and secondary heat treatment. The primary heat treatment is for partial imidization, and may be performed at about 100° C. to 200° C. for about 5 to 15 minutes, and the second heat treatment is for complete imidization, and may be performed at about 250° C. to 850° C. for about 5 to 25 minutes. In the process of the secondary heat treatment, it is preferable to apply a certain tension because residual stress generated in a process of forming film can be removed.

These examples are not different from conventional methods, and it is obvious to those skilled in the art that other methods not described above may be applied.

Figure 12:
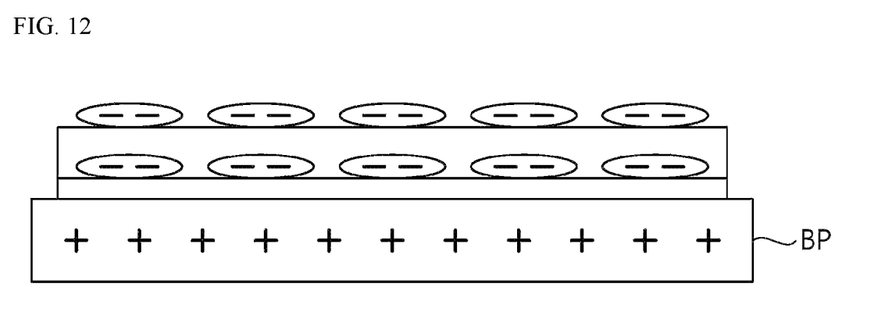
FIG. 12 is a cross-sectional view showing the process of step S140 of FIG. 6 for manufacturing the polyimide shown in FIG. 5.

FIG. 12 is a cross-sectional view showing the process of step S140 of FIG. 6 for manufacturing the polyimide shown in FIG. 5.

Referring to FIG. 12, fluororesin particles 120 are again applied to the upper surface of the polyimide precursor 110b applied through the step S160 process shown in FIG. 10, and the subsequent processes are performed to for a polyimide film. Hereinafter, repeated description will be omitted.

Figure 13:
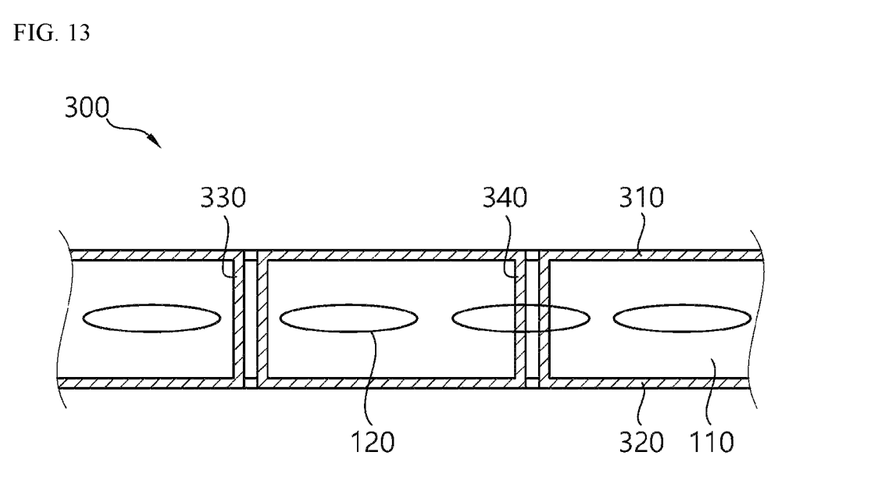
FIG. 13 is a schematic cross-sectional view showing an FPCB according to an exemplary embodiment of the present invention.

FIG. 13 is a schematic cross-sectional view showing an FPCB according to an exemplary embodiment of the present invention. The FPCB shown in FIG. 13 is manufactured using the polyimide film according to the previous embodiments, and the same or similar components are denoted by the same reference numerals, and further descriptions will be omitted.

Referring to FIG. 13, an FPCB 300 according to an exemplary embodiment of the present invention includes a polyimide layer 110, a plurality of fluororesin particles 120, a first conductive pattern layer 310, a second conductive pattern layer 320 and vias 330 and 340.

The first conductive pattern layer 310 is formed on a first surface of the polyimide layer 110. The second conductive pattern layer 320 is formed on a second surface of the polyimide layer 110. The vias 330 and 340 pass through the polyimide layer 110 to electrically connect the first conductive pattern layer 310 and the second conductive pattern layer 320.

Therefore, not only the first via 330 formed in the region where the fluororesin particles 120 do not exist, but also the second via 340 formed through the fluororesin particles 120 can stably connect the first and second conductive pattern layers 310 and 320 with each other, as shown in the FIG. 13, so that the problem such as disconnection can be solved.

As described above, according to the polyimide film according to the present invention, the dielectric constant of the substrate can be reduced, the thickness can be reduced, and a stable via with a low possibility of disconnection can be formed.

It will be apparent to those skilled in the art that various modifications and variation may be made in the present invention without departing from the spirit or scope of the invention. Thus, it is intended that the present invention cover the modifications and variations of this invention provided they come within the scope of the appended claims and their equivalents.

What is claimed is:

1. A method of manufacturing polyimide film, comprising:
charging a base plate with a first charge;
applying a first polyimide precursor to the base plate;
charging first fluororesin particles having a spherical or flat shape with a second charge that is opposite to the first charge;
after the charging of the first fluororesin particles, dispersing the first fluororesin particles in the first polyimide precursor;
applying a second polyimide precursor to the first polyimide precursor with the dispersed first fluororesin particles;
heat-treating the first polyimide precursor and the second polyimide precursor; and
separating the base plate.

2. The method of claim 1, further comprising:
spraying a third polyimide precursor onto the first polyimide precursor with the dispersed first fluororesin particles, before applying of the second polyimide precursor,
wherein the heat-treating of the first polyimide precursor and the second polyimide precursor comprises heat-treating of the third polyimide precursor.

3. The method of claim 1, further comprising:
scraping a top surface of the second polyimide precursor, before the heat-treating of the first and second polyimide precursor.

4. The method of claim 1, further comprising:
dispersing second fluororesin particles having a spherical or flat shape on an upper surface of the second polyimide precursor, before the heat-treating of the first and second polyimide precursor.

* * * * *